(12) United States Patent
Leng

(10) Patent No.: US 10,560,090 B2
(45) Date of Patent: Feb. 11, 2020

(54) ONE-WAY CONDUCTION DEVICE

(71) Applicant: NIKO SEMICONDUCTOR CO., LTD., New Taipei (TW)

(72) Inventor: Chung-Ming Leng, New Taipei (TW)

(73) Assignee: NIKO SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 16/143,393

(22) Filed: Sep. 26, 2018

(65) Prior Publication Data

US 2019/0140636 A1  May 9, 2019

(30) Foreign Application Priority Data

Nov. 3, 2017  (TW) .............................. 106138117 A

(51) Int. Cl.
*H03K 17/00* (2006.01)
*H03K 17/30* (2006.01)

(52) U.S. Cl.
CPC ..... *H03K 17/302* (2013.01); *H03K 2017/307* (2013.01)

(58) Field of Classification Search
CPC combination set(s) only.
See application file for complete search history.

(56) References Cited

U.S. PATENT DOCUMENTS

| | | | |
|---|---|---|---|
| 5,825,214 A * | 10/1998 | Klosa | G05F 1/575 327/104 |
| 5,831,471 A * | 11/1998 | Nakajima | G05F 1/575 327/540 |
| 7,190,207 B2 | 3/2007 | Chen | |
| 7,327,149 B2 * | 2/2008 | Chapuis | G01R 19/0092 323/282 |
| 8,232,829 B2 * | 7/2012 | Robinson, III | H02M 7/217 327/330 |
| 9,000,825 B2 * | 4/2015 | van Liempd | H03K 3/012 327/104 |
| 9,324,530 B2 | 4/2016 | Gueltig | |
| 9,515,518 B2 | 12/2016 | Reynolds | |
| 9,621,020 B2 | 4/2017 | Hu et al. | |
| 9,774,321 B1 * | 9/2017 | Chen | H03K 17/6877 |
| 9,887,578 B2 * | 2/2018 | Utsuno | H02J 7/35 |
| 10,056,787 B2 * | 8/2018 | Morikawa | H02J 50/12 |
| 10,079,536 B2 * | 9/2018 | Ishimaru | H02M 7/217 |
| 10,116,291 B2 * | 10/2018 | Manohar | H03K 5/08 |
| 2019/0148931 A1 * | 5/2019 | Li | H02H 3/18 |

* cited by examiner

*Primary Examiner* — Thomas J. Hiltunen
(74) *Attorney, Agent, or Firm* — Li & Cai Intellectual Property Office

(57) ABSTRACT

A one-way conduction device includes a first transistor and a driving circuit. The driving circuit includes a first circuit, a second circuit and a detection circuit. The first transistor is coupled between an input end and an output end of the one-way conduction device. In the first circuit, a first conduction unit is coupled between the input end of the one-way conduction device and a first resistor. In the second circuit, a second conduction unit is coupled between the output end of the one-way conduction device and a second resistor. In the driving circuit, the detection circuit detects whether a current flows from the first circuit to the second circuit, and accordingly turns on or turns off the first transistor. In this manner, the driving circuit can control the turning on and off of the one-way conduction device.

10 Claims, 5 Drawing Sheets

ONE-WAY CONDUCTION DEVICE

CROSS-REFERENCE TO RELATED PATENT APPLICATION

This application claims the benefit of priority to Taiwan Patent Application No. 106138117, filed on Nov. 3, 2017. The entire content of the above identified application is incorporated herein by reference.

BACKGROUND OF THE INVENTION

1. Field of the Invention

The present disclosure relates to a one-way conduction device; in particular, to a one-way conduction device having less power loss.

2. Description of Related Art

Diodes are circuit elements often used in circuit design. A diode can help control a current to flow along single direction. When a forward bias voltage is applied by the diode, the voltages at two ends of the diodes remain constant within an available current range, but when a reverse bias voltage is applied to the diode, the diode will be cut off. For example, the diode can be used at the power input end of a power supply circuit to prevent a current from the battery of a charged device from flowing back. In addition, the diode can be used in a power supply circuit having two power input ends to make a current flow from one power input end to the other power input end and to make sure that no current can flow back to the one power input end.

Although the voltage drop of a diode is roughly 0.6V when a forward bias voltage is applied to the diode, in practice, when a forward bias voltage is applied to the diode, the voltage drop of a diode is actually 1V~1.2V. Assuming that the current flowing through the diode is 10 A, the power loss caused by the diode would be 10 W~12 W.

Moreover, when a reverse bias voltage is applied to the diode, although the diode is cut off, there will be a reverse current flowing from the anode of the diode to the cathode of the diode due to the carrier drift. This reverse current is called a current leakage. The current leakage results in unwanted power loss, thus reducing the power efficiency of the entire circuit.

SUMMARY OF THE INVENTION

To overcome the above disadvantages, the present disclosure provides a one-way conduction device. The one-way conduction device has an input end and an output end, and includes a first transistor and a driving circuit. The first end of the first transistor is coupled to the input end, and the second end of the first transistor is coupled to the output end. The driving circuit includes a first circuit, a second circuit and a detection circuit. The first circuit includes a first conduction unit and a first resistor. The first conduction unit is coupled between the input end and one end of the first resistor, and the other end of the first resistor is coupled to a reference voltage. The second circuit includes a second conduction unit and a second resistor. The second conduction unit is coupled between the output end and the second resistor, and the other end of the second resistor is coupled to the reference voltage. The detection circuit is coupled to a node between the first conduction unit and the first resistor, a node between the second conduction unit and the second resistor, and the third end of the first transistor. The driving circuit detects whether a current flows from the node between the first conduction unit and the first resistor to the node between the second conduction unit and the second resistor through the detection circuit, and accordingly turns on or turns off the first transistor to control the turning on and turning off of the one-way conduction device.

In one embodiment of the one-way conduction device provided by the present disclosure, the detection circuit includes a third conduction unit, a second transistor and a third transistor. The third conduction unit is coupled between the node between the first conduction unit and the first resistor and the node between the second conduction unit and the second resistor. The first end and the second end of the second transistor are connected respectively to two ends of the third conduction unit, and the third end of the second transistor is coupled to the reference voltage through a third resistor. The first end of the third transistor is coupled to the third end of the first transistor, the second end of the third transistor is coupled to the reference voltage, and the third end of the third transistor is coupled between the third end of the second transistor and the third resistor.

By virtue of the above described circuit configuration, the power loss of the one-way conduction device provided by the present disclosure can be much less than a one-way conduction device using a diode as the switching element. With less power loss, the power loss of the one-way conduction device provided by the present disclosure can have a better power efficiency.

For further understanding of the present disclosure, reference is made to the following detailed description illustrating the embodiments of the present disclosure. The description is only for illustrating the present disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF EXEMPLARY EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings. In these drawings, like references indicate similar elements.

It will be understood that, although the terms first, second, third, and the like, may be used herein to describe various elements, these elements should not be limited by these terms. These terms are only to distinguish one element from another element, and the first element discussed below could be termed a second element without departing from the teachings of the instant disclosure. As used herein, the term "and/or" includes any and all combinations of one or more of the associated listed items.

One Embodiment of the One-Way Conduction Device

Figure 1:
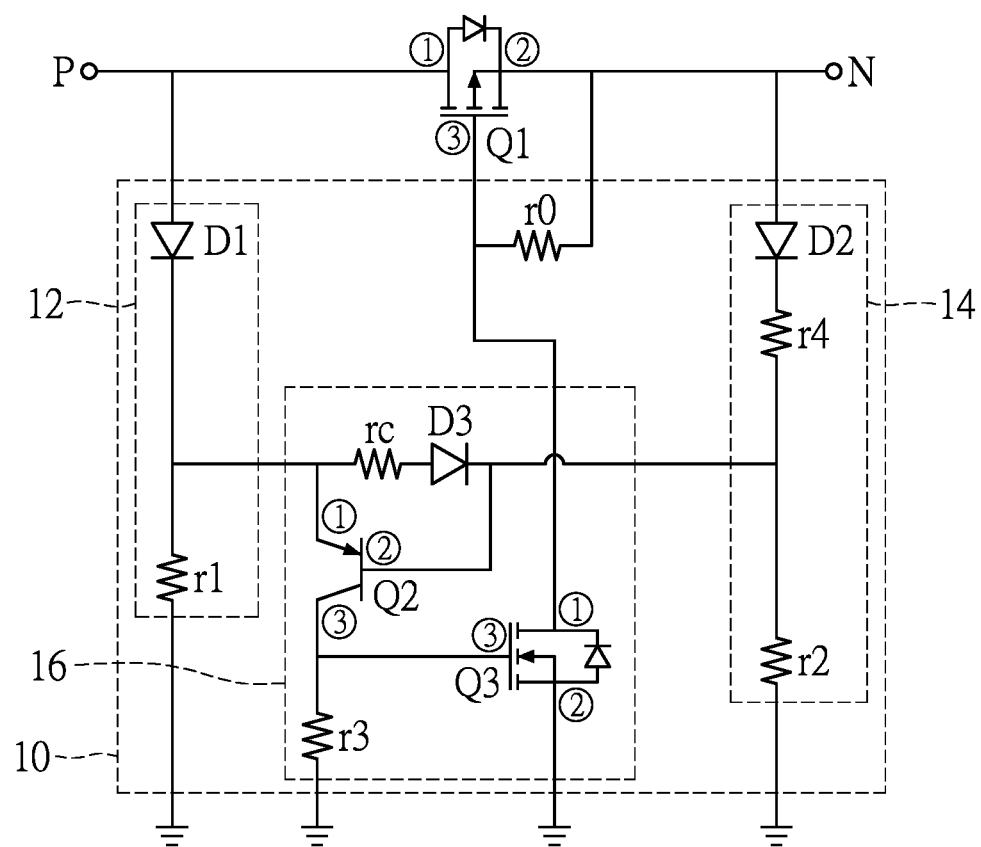
FIG. 1 shows a circuit diagram of a one-way conduction device according to one embodiment of the present disclosure.

Referring to FIG. 1, a circuit diagram of a one-way conduction device according to one embodiment of the present disclosure is shown.

As shown in FIG. 1, the one-way conduction device provided by this embodiment includes a first transistor Q1 and a driving circuit 10. The first end of the first transistor Q1 is coupled to an input end of the one-way conduction device, and the second end of the first transistor Q1 is coupled to an output end of the one-way conduction device. For ease of illustration, in FIG. 1, the first end of the first transistor Q1 is labeled as ①, the second end of the first transistor Q1 is labeled as ②, and the third end of the first transistor Q1 is labeled as ③.

In addition, the driving circuit 10 includes a first circuit 12, a second circuit 14 and a detection circuit 16. The first circuit 12 includes a first conduction unit D1 and a first resistor r1. The first conduction unit D1 is coupled between the input end of the one-way conduction device and one end of the first resistor r1, and the other end of the first resistor r1 is coupled to a reference voltage. The second circuit 14 includes a second conduction unit D2 and a second resistor r2. The second conduction unit D2 is coupled between the output end of the one-way conduction device and one end of the second resistor r2, and the other end of the second resistor r2 is coupled to the reference voltage. It should be noted that, in this embodiment, the reference voltage can be designed according to actual needs, and in FIG. 1, the reference voltage is, for example, a grounding voltage. Moreover, the detection circuit 16 is coupled to the node between the first conduction unit D1 and the first resistor r1, the node between the second conduction unit D2 and the second resistor r2 and the third end of the first transistor Q1.

In this embodiment, the driving circuit 10 detects whether a current flows from the node between the first conduction unit D1 and the first resistor r1 to the node between the second conduction unit D2 and the second resistor r2 through the detection circuit 16, and accordingly generates a voltage signal to turn on or turn off the first transistor Q1. When the first transistor Q1 is turned on, a current path forms between the input end and the output end of the one-way conduction device. On the other hand, when the first transistor Q1 is turned off, an open circuit forms between the input end and the output end of the one-way conduction device. Thus, the turning on and the turning off of the one-way conduction device can be controlled by the driving circuit 10.

One of features of the one-way conduction device provided by this embodiment is that, the first transistor Q1 is a MOS transistor. Compared with a diode, the turn-on voltage of the MOS transistor is much less than the turn-on voltage of the diode. Thus, when they are both turned on, the power consumed by the MOS transistor is much less than the power consumed by the diode. In addition, the diode only has two pins, and thus when it is used in the one-way conduction device as the switching element, the turning on and the turning off of the diode is controlled by the voltage difference between the pins of the diode (i.e., the voltage difference between the input end and the output end of the one-way conduction device). However, the MOS transistor has three pins, and thus when it is used in the one-way conduction device as the switching element, the turning on and the turning off of the MOS transistor can be controlled by a voltage signal that is transmitted to the control end of the MOS transistor by the driving circuit 10.

As shown in FIG. 1, the driving circuit 10 further includes a switching resistor r0. The switching resistor r0 is coupled between the second end and the third end of the first transistor Q1. In this embodiment, the first transistor Q1 is a PMOS transistor. The first end of the first transistor Q1 is a drain, the second end of the first transistor Q1 is a source, and the third end of the first transistor Q1 is a gate. It should be noted that, since the first transistor Q1 is a PMOS transistor, in FIG. 1, the input end of the one-way conduction device is labeled as "P" and the output end of the one-way conduction device is labeled as "N".

Due to the fact that the first transistor Q1 is a PMOS transistor, when the current flowing from the node between the first conduction unit D1 and the first resistor r1 to the node between the second conduction unit D2 and the second resistor r2 is detected by the driving circuit 10 through the detection circuit 16, the driving circuit 10 generates a voltage signal at low level to turn on the first transistor Q1, such that a current path forms between the input end and the output end of the one-way conduction device. On the other hand, when no current flows from the node between the first conduction unit D1 and the first resistor r1 to the node between the second conduction unit D2 and the second resistor r2, the driving circuit 10 generates a voltage signal at high level to turn off the first transistor Q1, such that an open circuit forms between the input end and the output end of the one-way conduction device.

In the following descriptions, how the driving circuit 10 generates the voltage signal through the detection circuit 16 to turn on or turn off the first transistor Q1 is illustrated.

As shown in FIG. 1, the detection circuit 16 includes a third conduction unit D3, a second transistor Q2 and a third transistor Q3. The third conduction unit D3 is coupled between the node between the first conduction unit D1 and the first resistor r1 of the first circuit 12 and the node between the second conduction unit D2 and the second resistor r2 of the second circuit 14. The first end and the second end of the second transistor Q2 are connected respectively to two ends of the third conduction unit D3, and the third end of the second transistor Q2 is coupled to the reference voltage through a third resistor r3. The first end of the third transistor Q3 is coupled to the third end of the first transistor Q1, the second end of the third transistor Q3 is coupled to the reference voltage, and the third end of the third transistor Q3 is coupled between the third end of the second transistor Q2 and the third resistor r3. For ease of illustration, in FIG. 1, the first ends of the second transistor Q2 and the third transistor Q3 are labeled as ①, the second ends of the second transistor Q2 and the third transistor Q3 are labeled as ②, and the third ends of the second transistor Q2 and the third transistor Q3 are labeled as ③.

In this embodiment, the third conduction unit D3 is a diode, and a fourth resistor r4 is coupled to the second conduction unit D2 and the node between the second conduction unit D2 and the second resistor r2. In addition, the second transistor Q2 is a PNP type bipolar junction transistor, and the third transistor Q3 is an NMOS transistor. The first end of the second transistor Q2 is an emitter, the second end of the second transistor Q2 is a base, and the third end of the second transistor Q2 is a collector. Moreover, the third transistor Q3 is an NMOS transistor. The first end of the third transistor Q3 is a drain, the second end of the third transistor Q3 is a source, and the third end of the third transistor Q3 is a gate.

It is worth mentioning that, in this embodiment, the resistance values of the first resistor r1, the second resistor r2, the third resistor r3 and the fourth resistor r4 are specifically designed, such that the voltage at the node between the first conduction unit D1 and the first resistor r1 is roughly 0.6V~0.7V larger than the voltage at the node between the second conduction unit D2 and the second resistor r2 when a current path forms between the input end and the output end of the one-way conduction device. In this manner, as long as the voltage at the node between the first conduction unit D1 and the first resistor r1 is roughly 0.6V~0.7V (i.e., the turn-on voltage of a diode) larger than the voltage at the node between the second conduction unit D2 and the second resistor r2, the third conduction unit D3 can be turned on. Otherwise, once the voltage at the node between the first conduction unit D1 and the first resistor r1 is not larger than the voltage at the node between the second conduction unit D2 and the second resistor r2 (i.e., the voltage at the node between the first conduction unit D1 and the first resistor r1 is larger than the voltage at the node between the second conduction unit D2 and the second resistor r2 but their voltage difference is less than 0.6V~0.7V, or the voltage at the node between the first conduction unit D1 and the first resistor r1 is even less than the voltage at the node between the second conduction unit D2 and the second resistor r2), the third conduction unit D3 will not be turned on.

When the voltage at the node between the first conduction unit D1 and the first resistor r1 is roughly 0.6V~0.7V larger than the voltage at the node between the second conduction unit D2 and the second resistor r2, the third conduction unit D3 is turned on and a current flows from the node between the first conduction unit D1 and the first resistor r1 to the node between the second conduction unit D2 and the second resistor r2. Thus, a forward bias voltage is applied to the first end of the second transistor Q2 and the voltage at the second transistor Q2 is at low level, such that the second transistor Q2 is turned on. After that, due to the voltage drop of the third resistor r3, the voltage at the third end of the third transistor Q3 is at high level, such that the third transistor Q3 is also turned on. Once the third transistor Q3 is turned on, the voltage at the third end of the first transistor Q1 will drop to a low level. As a result, the first transistor Q1 is turned on, and a current path forms between the input end and the output end of the one-way conduction device.

On the other hand, when the voltage at the node between the first conduction unit D1 and the first resistor r1 is not larger than the voltage at the node between the second conduction unit D2 and the second resistor r2, the third conduction unit D3 cannot be turned on because the turn-on voltage of the third conduction unit D3 cannot be provided by the voltage difference between the voltage at the node between the first conduction unit D1 and the first resistor r1 and the voltage at the node between the second conduction unit D2 and the second resistor r2. As a result, an open circuit forms between the node between the first conduction unit D1 and the first resistor r1 and the node between the second conduction unit D2 and the second resistor r2. Under this circumstance, the second transistor Q2 and the third transistor Q3 cannot be turned on, and the voltage at the third end of the first transistor Q1 will not drop to a low level. At this time, the voltage at the third end of the first transistor Q1 is raised to a high level due to the existence of a switching resistor r0. Thus, the first transistor Q1 is turned off such that an open circuit forms between the input end and the output end of the one-way conduction device.

Briefly, according to the above descriptions, when a current flowing from the node between the first conduction unit D1 and the first resistor r1 to the node between the second conduction unit D2 and the second resistor r2 is detected by the driving circuit 10 through the detection circuit 16, the first transistor Q1 is turned on; on the other hand, when no current flows from the node between the first conduction unit D1 and the first resistor r1 to the node between the second conduction unit D2 and the second resistor r2, the first transistor Q1 is turned off.

It should be noted that, considering the characteristics of a diode, in this embodiment, a calibration resistor rc can be disposed between the first end of the second transistor Q2 and the third conduction unit D3 to adjust the sensitivity of the second transistor Q2. Alternatively, the calibration resistor rc can also be disposed between the second end of the second transistor Q2 and the third conduction unit D3, but the present disclosure is not limited thereto.

Another Embodiment of the One-Way Conduction Device

Figure 2:
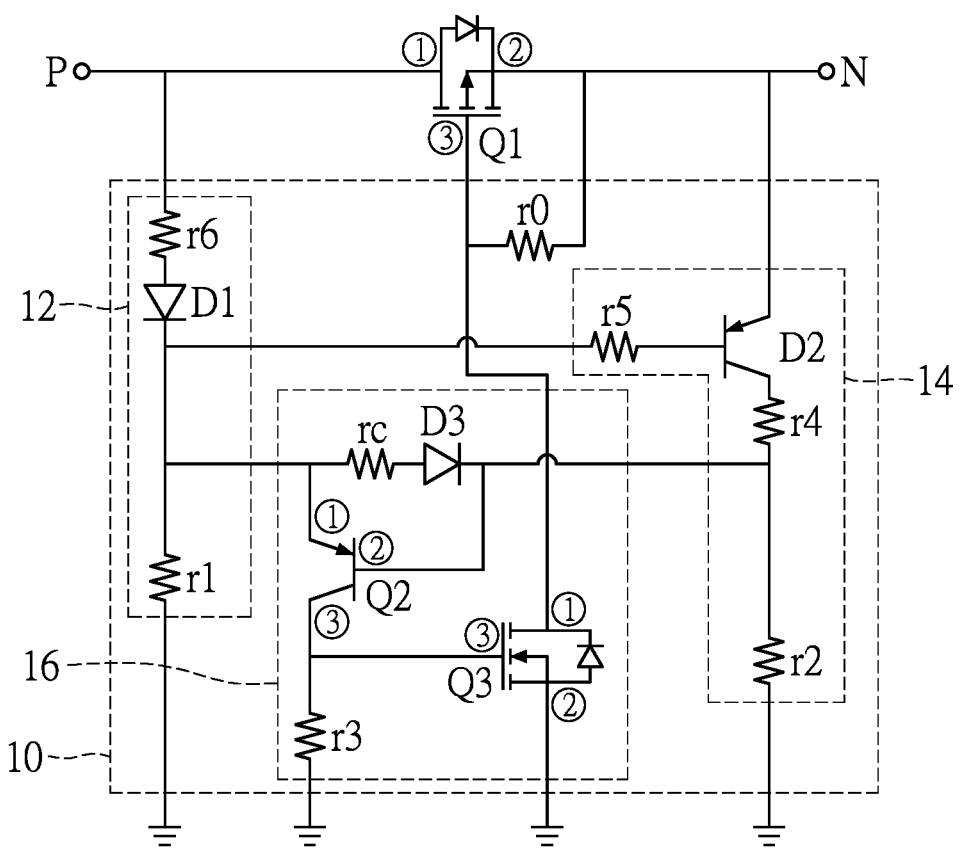
FIG. 2 shows a circuit diagram of a one-way conduction device according to another embodiment of the present disclosure.

Referring to FIG. 2, a circuit diagram of a one-way conduction device according to another embodiment of the present disclosure is shown.

The one-way conduction device provided by this embodiment and the one-way conduction device shown in FIG. 1 have similar circuit structures and working principles. Thus, in the following descriptions, only differences between them are illustrated, while other details on the one-way conduction device provided by this embodiment can be referred to in the descriptions above.

The major difference between the one-way conduction device provided by this embodiment and the one-way conduction device shown in FIG. 1 is that, as shown in FIG. 2, the first conduction unit D1 of the first circuit 12 is a diode, but the second conduction unit D2 of the second circuit 14 is a PNP type bipolar junction transistor. The emitter of the second conduction unit D2 is coupled to the output end of the one-way conduction device, the collector of the second conduction unit D2 is grounded or coupled to a reference voltage through a second resistor r2, and the base of the second conduction unit D2 is coupled to the node between the first conduction unit D1 and the first resistor r1 through a fifth resistor r5. In addition, a sixth resistor r6 is coupled between the input end of the one-way conduction device and the first conduction unit D1 of the first circuit 12. It should be noted that, in this embodiment, the sixth resistor r6 is an optional element; in other words, the circuit designer can choose to include the sixth resistor r6 between the input end of the one-way conduction device and the first conduction unit D1 of the first circuit 12 or not, and also that the resistance of the sixth resistor r6 can be freely adjusted.

It is worth mentioning that, in this embodiment, the resistance values of the first resistor r1, the second resistor r2, the fifth resistor r5 and the sixth resistor r6 are specifically designed, such that the voltage at the node between the first conduction unit D1 and the first resistor r1 is roughly 0.6V~0.7V larger than the voltage at the node between the second conduction unit D2 and the second resistor r2 when a current path forms between the input end and the output end of the one-way conduction device.

Still Another Embodiment of the One-Way Conduction Device

Figure 3:
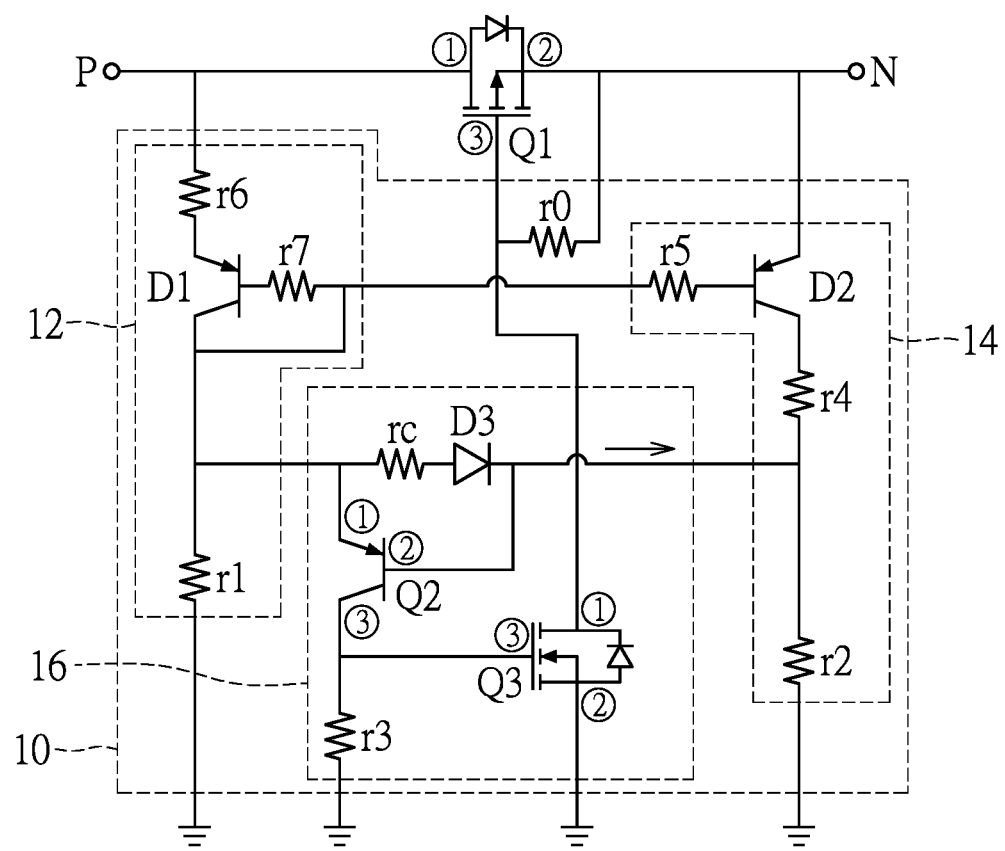
FIG. 3 shows a circuit diagram of a one-way conduction device according to still another embodiment of the present disclosure.

Referring to FIG. 3, a circuit diagram of a one-way conduction device according to still another embodiment of the present disclosure is shown.

The one-way conduction device provided by this embodiment and the one-way conduction devices shown in FIG. 1 and FIG. 2 have similar circuit structures and working principles. Thus, in the following descriptions, only differences among them are illustrated, while other details on the one-way conduction device provided by this embodiment can be referred to in the descriptions above.

The major difference among the one-way conduction device provided by this embodiment and the one-way conduction devices shown in FIG. 1 and FIG. 2 is that, as shown in FIG. 3, the first conduction unit D1 of the first circuit 12 is a PNP type bipolar junction transistor, and the second conduction unit D2 of the second circuit 14 is also a PNP type bipolar junction transistor.

The emitter of the first conduction unit D1 is coupled to the input end of the one-way conduction device through a sixth resistor r6, the base of the first conduction unit D1 is coupled to the collector of the first conduction unit D1 through a seventh resistor r7, and is further coupled to the node between the first conduction unit D1 and the first resistor r1. In addition, the emitter of the second conduction unit D2 is coupled to the output end of the one-way conduction device, the emitter of the second conduction unit D2 is coupled to the second resistor r2 and the third conduction unit D3 through a fourth resistor r4, and the base of the second conduction unit D2 is coupled between the seventh resistor r7 and the node between the first conduction unit D1 and the first resistor r1 through a fifth resistor r5.

It is worth mentioning that, in this embodiment, the resistance values of the first resistor r1, the second resistor r2, the third resistor r3, the fourth resistor r4 and the sixth resistor r6 are specifically designed, such that the voltage at the node between the first conduction unit D1 and the first resistor r1 is roughly 0.6V~0.7V larger than the voltage at the node between the second conduction unit D2 and the second resistor r2 when a current path forms between the input end and the output end of the one-way conduction device.

Still Another Embodiment of the One-Way Conduction Device

Figure 4:
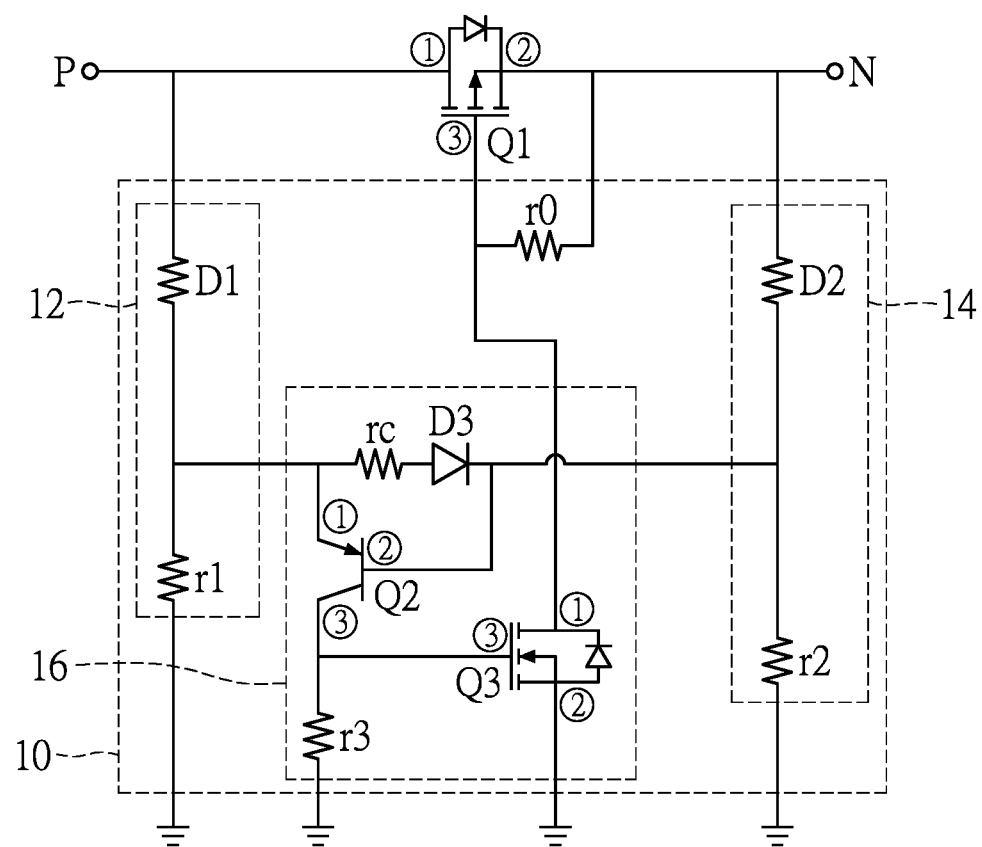
FIG. 4 shows a circuit diagram of a one-way conduction device according to still another embodiment of the present disclosure.

Referring to FIG. 4, a circuit diagram of a one-way conduction device according to still another embodiment of the present disclosure is shown.

The one-way conduction device provided by this embodiment and the one-way conduction devices shown in FIGS. 1-3 have similar circuit structures and working principles. Thus, in the following descriptions, only differences among them are illustrated, while other details on the one-way conduction device provided by this embodiment can be referred to in the descriptions above.

The major difference among the one-way conduction device provided by this embodiment and the one-way conduction devices shown in FIGS. 1-3 is that, as shown in FIG. 4, the first conduction unit D1 of the first circuit 12 is a resistor, and the second conduction unit D2 of the second circuit 14 is also a resistor.

It is worth mentioning that, in this embodiment, the resistance values of the first resistor r1, the second resistor r2, the third resistor r3, the first conduction unit D1 and the second conduction unit D2 are specifically designed, such that the voltage at the node between the first conduction unit D1 and the first resistor r1 is roughly 0.6V~0.7V larger than the voltage at the node between the second conduction unit D2 and the second resistor r2 when a current path forms between the input end and the output end of the one-way conduction device.

Still Another Embodiment of the One-Way Conduction Device

Figure 5:
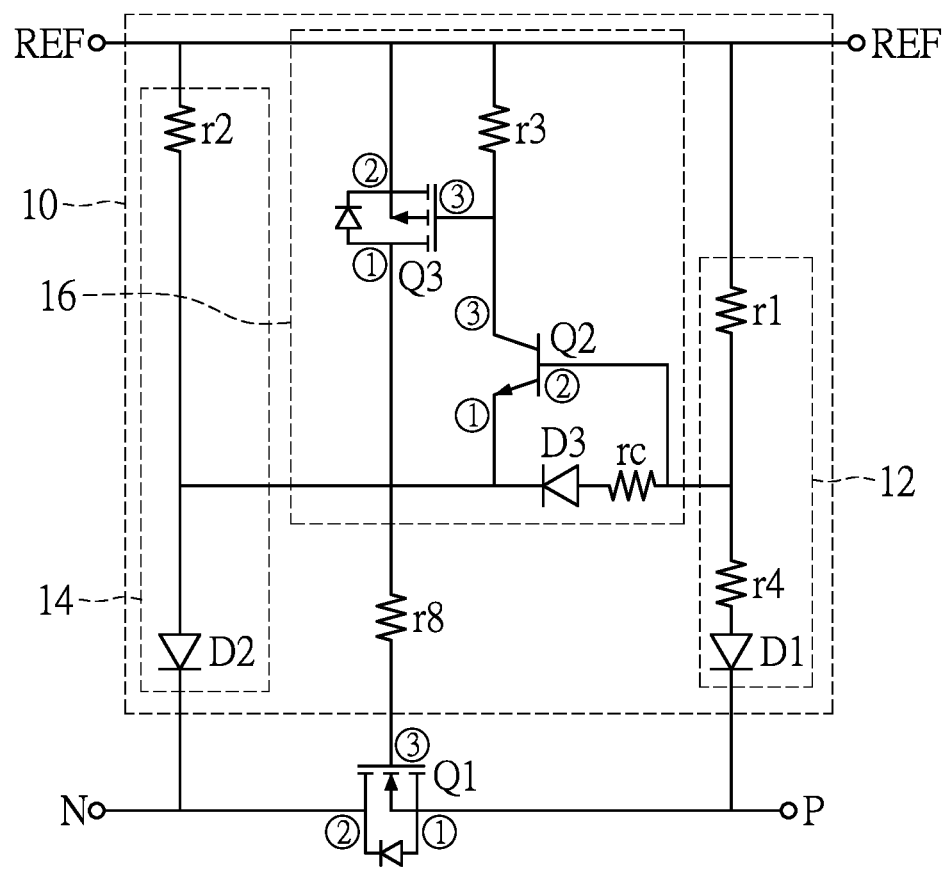
FIG. 5 shows a circuit diagram of a one-way conduction device according to still another embodiment of the present disclosure.

Referring to FIG. 5, a circuit diagram of a one-way conduction device according to still another embodiment of the present disclosure is shown.

The one-way conduction device provided by this embodiment and the one-way conduction devices shown in FIGS. 1-4 have similar circuit structures and working principles. Thus, in the following descriptions, only differences among them are illustrated, while other details on the one-way conduction device provided by this embodiment can be referred to in the descriptions above.

The major difference among the one-way conduction device provided by this embodiment and the one-way conduction devices shown in FIGS. 1—4 is that, the voltages at the input end and the output end of the one-way conduction device provided in this embodiment are less than the reference REF or even less than 0V. As shown in FIG. 5, for example, the input end and the output end of the one-way conduction device are coupled to a negative voltage, and the reference voltage REF is 0V. For another example, the reference voltage REF can be a positive voltage or even a high voltage, as long as the voltages at the input end and the output end of the one-way conduction device are less than the reference voltage REF.

In this embodiment, the voltages at the input end and the output end of the one-way conduction device provided in this embodiment are less than the reference REF or even less than 0V, so that the first transistor Q1 is an NMOS transistor, the first end of the first transistor Q1 is a source, the second end of the first transistor Q1 is a drain, and the third end of the first transistor Q1 is a gate. In addition, the second transistor Q2 should be an NPN type bipolar junction transistor, and the third transistor Q3 should be a PMOS transistor. The first end of the second transistor Q2 is an emitter, the second end of the second transistor Q2 is a base, and the third end of the second transistor Q2 is a collector. The first end of the third transistor Q3 is a drain, the second end of the third transistor Q3 is a source, and the third end of the third transistor Q3 a gate. Moreover, the first end of the third transistor Q3 is coupled to the third end of the first transistor Q1 through an eighth resistor r8.

The working principle of the one-way conduction device provided by this embodiment is that, when the third conduction unit D3 is turned on and a current flows from the node between the first conduction unit D1 and the first resistor r1 to the node between the second conduction unit D2 and the second resistor r2, the second transistor Q2 and the third transistor Q3 will be turned on such that the driving circuit 10 turns on the first transistor Q1. In addition, when the third conduction unit D3 is turned off, no current flows from the node between the first conduction unit D1 and the first resistor r1 to the node between the second conduction unit D2 and the second resistor r2, so that the second transistor Q2 and the third transistor Q3 cannot be turned on, and the driving circuit 10 turns off the first transistor Q1.

In terms of circuit configuration, the differences among the one-way conduction device provided by this embodiment and the one-way conduction devices shown in FIGS. 1-4 are only that, in this embodiment, the first transistor Q1 is an NMOS transistor and not a PMOS transistor, the second transistor Q2 is an NPN type bipolar junction transistor and not a PNP type bipolar junction transistor, and the third transistor Q3 is a PMOS transistor and not an NMOS transistor. Thus, other details on the circuit configuration of the one-way conduction device provided by this embodiment can be referred to in the descriptions above.

To sum up, in the present disclosure, a MOS transistor is used as a switching element between the input end and the output end of the one-way conduction device. Compared with a diode, the turn-on voltage of a MOS transistor is much less than the turn-on voltage of a diode. Thus, when they are both turned on, the power consumed by the MOS transistor is much less than the power consumed by the diode.

Moreover, with a MOS transistor as the switching element between the input end and the output end of the one-way conduction device, the driving circuit of the present disclosure determines whether to turn on the MOS transistor through a detection circuit. The circuit configuration of the detection circuit is not complex but sufficient to sensitively detect the variation of the voltages at the input end and the output end of the one-way conduction device, so that the turning on and the turning off of the one-way conduction device can be precisely controlled.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A one-way conduction device, having an input end and an output end, comprising:
   a first transistor, wherein the first end of the first transistor is coupled to the input end, and the second end of the first transistor is coupled to the output end; and
   a driving circuit, including:
      a first circuit, including a first conduction unit and a first resistor, wherein the first conduction unit is coupled between the input end and one end of the first resistor, and the other end of the first resistor is coupled to a reference voltage;
      a second circuit, including a second conduction unit and a second resistor, wherein the second conduction unit is coupled between the output end and the second resistor, and the other end of the second resistor is coupled to the reference voltage; and
      a detection circuit, coupled to a node between the first conduction unit and the first resistor, a node between the second conduction unit and the second resistor, and the third end of the first transistor;
   wherein the driving circuit detects whether a current flows from the node between the first conduction unit and the first resistor to the node between the second conduction unit and the second resistor through the detection circuit, and accordingly turns on or turns off the first transistor to control the turning on and turning off of the one-way conduction device.

2. The one-way conduction device according to claim 1, wherein the first transistor is a PMOS transistor, the first end of the first transistor is a drain, the second end of the first transistor is a source, the third end of the first transistor is a gate, the driving circuit further includes a switching resistor, and the switching resistor is coupled between the second end and the third end of the first transistor;
   wherein when the current flowing from the node between the first conduction unit and the first resistor to the node between the second conduction unit and the second resistor is detected through the detection circuit, the driving circuit turns on the first transistor such that the one-way conduction device is turned on;
   wherein when no current flows from the node between the first conduction unit and the first resistor to the node between the second conduction unit and the second resistor, the driving circuit turns off the first transistor such that the one-way conduction device is turned off.

3. The one-way conduction device according to claim 1, wherein the first transistor is an NMOS transistor, the first end of the first transistor is a source, the second end of the first transistor is a drain, and the third end of the first transistor is a gate;
   wherein when the current flowing from the node between the first conduction unit and the first resistor to the node between the second conduction unit and the second resistor is detected through the detection circuit, the driving circuit turns on the first transistor such that the one-way conduction device is turned on;
   wherein when no current flows from the node between the first conduction unit and the first resistor to the node between the second conduction unit and the second resistor, the driving circuit turns off the first transistor such that the one-way conduction device is turned off.

4. The one-way conduction device according to claim 1, wherein the detection circuit includes:
   a third conduction unit, coupled between the node between the first conduction unit and the first resistor and the node between the second conduction unit and the second resistor;
   a second transistor, wherein the first end and the second end of the second transistor are connected respectively to two ends of the third conduction unit, and the third end of the second transistor is coupled to the reference voltage through a third resistor; and
   a third transistor, wherein the first end of the third transistor is coupled to the third end of the first transistor, the second end of the third transistor is coupled to the reference voltage, and the third end of the third transistor is coupled between the third end of the second transistor and the third resistor;
   wherein the third conduction unit is a diode.

5. The one-way conduction device according to claim 4, wherein the second transistor is a PNP type bipolar junction transistor, the first end of the second transistor is an emitter, the second end of the second transistor is a base and the third end of the second transistor is a collector, and the third transistor is an NMOS transistor, the first end of the third transistor is a drain, the second end of the third transistor is a source and the third end of the third transistor is a gate;
   wherein when the third conduction unit is turned on and the current flows from the node between the first conduction unit and the first resistor to the node between the second conduction unit and the second resistor, the second transistor and the third transistor are turned on such that the driving circuit turns on the first transistor;

wherein when the third conduction unit is turned off and no current flows from the node between the first conduction unit and the first resistor to the node between the second conduction unit and the second resistor, the second transistor and the third transistor are turned off such that the driving circuit turns off the first transistor.

6. The one-way conduction device according to claim 4, wherein the second transistor is a NPN type bipolar junction transistor, the first end of the second transistor is an emitter, the second end of the second transistor is a base and the third end of the second transistor is a collector, and the third transistor is a PMOS transistor, the first end of the third transistor is a drain, the second end of the third transistor is a source and the third end of the third transistor is a gate;

wherein when the third conduction unit is turned on and the current flows from the node between the first conduction unit and the first resistor to the node between the second conduction unit and the second resistor, the second transistor and the third transistor are turned on such that the driving circuit turns on the first transistor;

wherein when the third conduction unit is turned off and no current flows from the node between the first conduction unit and the first resistor to the node between the second conduction unit and the second resistor, the second transistor and the third transistor are turned off such that the driving circuit turns off the first transistor.

7. The one-way conduction device according to claim 1, wherein the first conduction unit of the first circuit is a diode, the second conduction unit of the second circuit is a diode, and a fourth resistor is coupled to the second conduction unit and the node between the second conduction unit and the second resistor.

8. The one-way conduction device according to claim 1, wherein the first conduction unit of the first circuit is a diode;

wherein the second conduction unit of the second circuit is a PNP type bipolar junction transistor, the emitter of the second conduction unit is coupled to the output end, the collector of the second conduction unit is coupled to the reference voltage through the second resistor, and the base of the second conduction unit is coupled to the node between the first conduction unit and the first resistor through a fifth resistor;

wherein a sixth resistor is coupled between the input end and the first conduction unit.

9. The one-way conduction device according to claim 1, wherein the first conduction unit of the first circuit is a PNP type bipolar junction transistor, the emitter of the first conduction unit is coupled to the input end through a sixth resistor, and the base of the first conduction unit is coupled to the collector of the first conduction unit through a seventh resistor and further coupled to the node between the first conduction unit and the first resistor;

wherein the second conduction unit of the second circuit is a PNP type bipolar junction transistor, the emitter of the second conduction unit is coupled to the output end, the collector of the second conduction unit is coupled to the second resistor and the third conduction unit through a fourth resistor, and the base of the second conduction unit is coupled to the seventh resistor and the node between the first conduction unit and the first resistor through a fifth resistor.

10. The one-way conduction device according to claim 1, wherein the first conduction unit of the first circuit is a resistor, and the second conduction unit of the second circuit is a resistor.

* * * * *